United States Patent
Magnusson (10) Patent No.: US 11,616,280 B2
(45) Date of Patent: Mar. 28, 2023

(54) TRANSMISSION LINE FOR VACUUM APPLICATIONS

(71) Applicant: RUAG SPACE AB, Gothenburg (SE)

(72) Inventor: Per Magnusson, Gothenburg (SE)

(73) Assignee: RUAG SPACE AB, Gothenburg (SE)

( * ) Notice: Subject to any disclaimer, the term of this patent is extended or adjusted under 35 U.S.C. 154(b) by 26 days.

(21) Appl. No.: 16/955,135

(22) PCT Filed: Dec. 21, 2017

(86) PCT No.: PCT/SE2017/051333
§ 371 (c)(1),
(2) Date: Jun. 18, 2020

(87) PCT Pub. No.: WO2019/125259
PCT Pub. Date: Jun. 27, 2019

(65) Prior Publication Data
US 2020/0321676 A1 Oct. 8, 2020

(51) Int. Cl.
*H01P 3/08* (2006.01)
(52) U.S. Cl.
CPC .................... *H01P 3/08* (2013.01)
(58) Field of Classification Search
CPC ........................................................ H01P 3/08
See application file for complete search history.

(56) References Cited

U.S. PATENT DOCUMENTS

| 4,053,855 | A | 10/1977 | Kivi et al. | |
|---|---|---|---|---|
| 5,160,906 | A | 11/1992 | Siomkos et al. | |
| 5,481,234 | A | 1/1996 | Landry et al. | |
| 2010/0141357 | A1 | 6/2010 | Gonzalez et al. | |
| 2015/0091675 | A1* | 4/2015 | Kato | H01P 3/084 333/238 |
| 2016/0174374 | A1 | 6/2016 | Kong et al. | |
| 2019/0067785 | A1* | 2/2019 | Messina | G01R 21/00 |

OTHER PUBLICATIONS

Extended European Search Report dated Jun. 28, 2021 for European Patent Application No. 17935119.2, 8 pages.
Vladimir E. Semenov et al. "General Study of Multipactor Between Curved Metal Surfaces", IEEE Transactions on Plasma Science, vol. 42, No. 3, Mar. 2014, pp. 721-728.
Vladimir E. Semenov et al. "Simulations of Multipactor Thresholds in Shielded Microstrip Lines", Journal of Physics D: Applied Physics, vol. 42, No. 20, Sep. 23, 2009.
(Continued)

*Primary Examiner* — Samuel S Outten
(74) *Attorney, Agent, or Firm* — Sage Patent Group (57) ABSTRACT

A microwave transmission line assembly operated in vacuum for satellite antennas and beamforming networks comprising a first ground plane and a conductor strip positioned a distance from the first ground plane. The conductor strip comprises a first strip portion and a second strip portion (6). The first strip portion is positioned at a first distance from the first ground plane and wherein the second strip portion is positioned at a second distance from the first ground plane. The first distance is smaller than the second distance, wherein the first distance is chosen to avoid multipaction.

19 Claims, 11 Drawing Sheets

(56) References Cited

OTHER PUBLICATIONS

Timothy P. Graves "Standard/Handbook for Multipactor Breakdown Prevention in Spacecraft Components", Aerospace Report No. TOR-2014-02198, prepared for Space and Missile Systems Center, Air Force Space Command, May 28, 2014, pp. 5-1, El Segundo, CA, USA,.

Richard Udiljak "Multipactor in Low Pressure Gas and in Nonuniform RF Field Structures", PhD Thesis, Department of Radio and Space Science, Chalmers University of Technology, ISBN 978-91-7291-885-6, 2007, pp. 28-34, Göteborg, Sweden.

PCT International Search Report and Written Opinion dated Sep. 20, 2018 for International Application PCT/SE2017/051333, 13 pages.

* cited by examiner

TRANSMISSION LINE FOR VACUUM APPLICATIONS

CROSS-REFERENCE TO RELATED APPLICATIONS

This application is a 35 U.S.C. § 371 national stage application for International Application No. PCT/SE2017/051333, entitled "A TRANSMISSION LINE FOR VACUUM APPLICATIONS", filed on Dec. 21, 2017, the disclosures and contents of which are hereby incorporated by reference in their entireties.

TECHNICAL FIELD

The present disclosure relates to a transmission line assembly operated in vacuum for satellite antennas and beamforming networks comprising a first and second ground plane positioned opposite each other and a central conductor strip positioned between and at a distance from the first and second ground planes.

BACKGROUND

In the field of air strip microwave transmission line assemblies it is known a problem with multipaction when increasing the power in the transmission line. The transmission line comprises a first and second ground plane positioned opposite each other and a central conductor strip there between. Multipaction refers to the phenomenon where an electron excited by the Radio Frequency field impacts the surface of the conductor or ground plane with an energy that is high enough to release one or more secondary electrons from the surface. Under resonant conditions, the direction of the Radio Frequency field is such that the electrons are accelerated towards the opposite surface where the process is repeated. When a sufficient number of free electrons have been excited, an unwanted discharge takes place over the transmission line. The traditional remedy for avoiding multipaction is to increase the distance between the conductor strip and the ground planes, but at the same time the conductor strip needs to be increased in size in order to maintain a predetermined impedance. This remedy has the disadvantage of a more bulky and expensive transmission line.

There is thus a need for an improved transmission line.

SUMMARY

An object of the present disclosure is to provide transmission line assembly operated in vacuum for satellite antennas and beamforming networks where the previously mentioned problems are avoided. This object is at least partly achieved by the features of the independent claims. The dependent claims contain further developments of the transmission line assembly.

The transmission line assembly comprises a first ground plane and a conductor strip positioned a distance from the first ground plane. The conductor strip comprises a first strip portion and a second strip portion. The first strip portion is positioned at a first distance from the first ground plane and the second strip portion is positioned at a second distance from the first ground plane. The first distance is smaller than the second distance and the first distance is chosen to avoid multipaction.

A transmission line is designed with a predetermined impedance and to allow a certain power. The design relates to the distance between the conductor strip and the ground plane or ground planes together with the shape and size of the conductor strip. In prior art the conductor strip has a rectangular cross-section and the ground plane a corresponding flat shape. In prior art it is well known that an increase in power also gives an increase in volume of the transmission line to avoid multipaction. The increase in volume relates to an increase in distance between the ground plane or planes and the conductor strip. In order to keep the impedance at the desired level the conductor strip needs to increase its geometrical cross-section, i.e. become wider. This has the negative effect of a bulkier and more expensive transmission line. According to the invention the power can be increased without increasing the volume. The invention also gives the possibility to diminish the volume of the transmission line for the same power compared to a prior art transmission line. The reason for the stated advantages is that the geometrical change of the conductor strip allows for maintained impedance in the transmission line at the same time as multipaction can be avoided. The geometrical change with the first strip portion positioned closer to the ground plane than the second strip portion changes the electromagnetic field in the transmission line, creating so called fringing fields, such that many excited electrons in the vicinity of the first strip portion travel in a direction essentially parallel to the ground plane rather than in a direct path towards the ground plane, wherein multipaction is avoided in this area.

According to one example the geometrical change of the conductor strip relates to a conductor strip with a rectangular cross section being arranged somewhat diagonally with reference to the ground plane or ground planes. Such an arrangement gives a conductor strip with an end portion, i.e. first strip portion, close to one ground plane and, if applicable, another end portion close to the second ground plane compared to the second strip portion being a portion of the conductor strip positioned between the end portions. In another example, one end portion, i.e. the first strip portion, is arranged close to the first ground plane, and the other end portion is maintained in the middle of the transmission line. Here, middle of the transmission line relates to the same position as the prior art position of the conductor strip.

According to one example, the conductor strip is bent or angled such that the first strip portion is positioned closer to the ground plane than the second strip portion.

It should be noted that for optimum performance a first width of the first strip portion has a length less than the first distance. Distance to the first ground plane is taken at the closest part of the first strip portion.

According to one example, the first ground plane comprises a first ground plane protrusion in connection to the first strip portion. Here, the first strip portion becomes closer to the first ground plane due to the first ground plane protrusion. Hence, in this example the conductor strip could have a rectangular cross-section. According to another example, the first strip portion protrudes towards the first ground plane with relation to the second strip portion, as discussed above, either by a diagonally arranged conductor strip or by a conductor strip being bent or angled. It is also possible to combine a first ground plane protrusion with a protruding first strip portion.

According to one example the conductor strip further comprises a third strip portion positioned at a third distance from the first ground plane and wherein the third distance is smaller than the second distance. Here, the second strip portion is positioned between the first strip portion and the third strip portion. In the same manner as the first strip portion, the third strip portion can be bent or angled in relation to the second strip portion. The introduction of a third strip portion is mainly there to lower the impedance without making the conductor strip wider. The introduction of the third strip portion further removes problem with multipaction due to changed electromagnetic field close to the third strip portion.

It should be noted that for optimum performance a third width of the third strip portion has a length less than the third distance. Distance to the first ground plane is taken at the closest part of the third strip portion.

The first distance is either equal to the third distance or the first distance is different from the third distance. The closest distance of the first distance or third distance will determine the worst case multipaction. If the first distance is greater than the third distance, the impedance will be higher than if the first distance is equal to the third distance, without providing any extra multipaction protection. Thus, the trade-off between impedance and multipaction will be balanced if the first distance is equal to the third distance. Hence, it is possible to use the relationship between the first distance and the third distance as a design parameter.

According to one example, the first ground plane comprises a second ground plane protrusion in connection to the third strip portion and/or wherein the third strip portion protrudes towards the first ground plane with relation to the second strip portion. The different possibilities have been discussed above in relation to the first ground plane protrusion.

The first strip portion is positioned at a predetermined first separation distance from the third strip portion. The first separation distance determines the impedance together with the distances between the strip portions and the first ground plane.

According to one example, the transmission line assembly comprises:
  a first and second ground plane positioned opposite each other and
  a central conductor strip positioned between and at a distance from the first and second ground planes, characterized in that the conductor strip comprises a first strip portion and a second strip portion. The first strip portion is positioned at a first distance from the first ground plane and wherein the second strip portion is positioned at a second distance from the first ground plane, wherein the first distance is smaller than the second distance.

The second strip portion is positioned at a fourth distance from the second ground plane.

According to one example, the fourth distance exceeds the second distance, and the fourth distance is big enough to avoid multipaction.

According to one example the conductor strip further comprises a fourth strip portion positioned at a fifth distance from the second ground plane and wherein the fifth distance is smaller than the fourth distance.

It should be noted that for optimum performance a fourth width of the fourth strip portion has a length less than the fifth distance. Distance to the second ground plane is taken at the closest part of the fourth strip portion.

According to one example, the second ground plane comprises a third ground plane protrusion in connection to the fourth strip portion and/or wherein the fourth strip portion protrudes towards the second ground plane with relation to the second strip portion.

According to one example, the second strip portion is positioned at the fourth distance from the second ground plane, wherein the conductor strip comprises a fifth strip portion positioned at a sixth distance from the second ground plane and wherein the sixth distance is smaller than the fourth distance.

It should be noted that for optimum performance a fifth width of the fifth strip portion has a length less than the sixth distance. Distance to the second ground plane is taken at the closest part of the fifth strip portion.

The fifth distance is equal to the sixth distance or the fifth distance is different from the sixth distance. The closest distance of the fifth distance or sixth distance will determine the worst case multipaction. If the fifth distance is greater than the sixth distance, the impedance will be higher than if the fifth distance is equal to the sixth distance, without providing any extra multipaction protection. Thus, the trade-off between impedance and multipaction will be balanced if the fifth distance is equal to the sixth distance. Hence, it is possible to use the relationship between the fifth distance and the sixth distance as a design parameter.

According to one example, the second ground plane comprises a fourth ground plane protrusion in connection to the fifth strip portion and/or wherein the fifth strip portion protrudes towards the second ground plane with relation to the second strip portion.

The fourth strip portion is positioned at a predetermined second separation distance from the fifth strip portion. The second separation distance determines the impedance together with the distances between the strip portions, i.e. the fourth and fifth strip portions, and the second ground plane.

The first ground plane is positioned at a seventh distance from the second ground plane.

For the width measurement of the protruding portions, i.e. the width of the protruding strip portions and/or the protruding ground plane portions, the measurement shall be done at the part closest to the ground plane and/or the conductor strip. However, the exact width of a pointy end is of course difficult to define, as well as the relevant width of a diagonally arranged part, but this is a design parameter and could be chosen to be a mean value of a the width close to the point or another suitable measure determined to be used. Thus, the definition of the width is strictly applicable to a particular version/example of the invention where the end portion of the strip portion is essentially parallel to the ground plane. Should the end portion of the strip portion be pointy or curved the width could be taken at a position where the pointy or curved end portion transitions into the main form of the strip portion, or as the above example mean value of a chosen point.

The disclosed transmission line also has the advantage that the design of the ground panel protrusions and/or the conductor strip portions and/or the distance between the ground plane/ground planes and different portions of the conductor strip can be optimized in junctions between two or more transmission lines as well as in curved strip lines. The size, height, distance to ground plane, distance between protrusions and/or strip portions, are all design parameters that can be used for matching/trimming of impedance etc.

It should be noted that the transmission line is not limited to four protruding portions that changes the distance between the conductor strip and the ground plane or ground planes. According to one example, the conductor strip comprises three protrusions on each side of the conductor strip. However, has been pointed out throughout the disclosure, the transmission line comprises at least one strip portion that has a distance to a ground plane lesser than another part of the conductor strip to avoid multipaction.

The examples in the disclosure have discussed a number of alternatives and it should be understood that the any combination of these alternatives are possible and that further alternatives with more protrusions with alternative distributions are possible.

According to one example, the end portions of one or more protruding strip portions comprises one or a number of minor protrusions toward the ground planes. Between the minor protrusions are created indentations/valleys that acts as an electron trap which further reduces multipaction.

According to one example, the end portions of one or more ground plane protrusions comprises one or a number of minor protrusions toward the ground planes. Between the minor protrusions are created indentations/valleys that acts as an electron trap which further reduces multipaction.

It is also possible to combine minor protrusions at the end portions of one or more protruding strip portions and minor protrusions at the end portions of one or more ground plane protrusions.

Furthermore, according to further examples the transmission line assembly comprises one or two side walls connecting the first and second ground planes. The side walls and the first and second ground planes can be arranged to encapsulate the conductor strip partly or entirely

BRIEF DESCRIPTION OF DRAWINGS

The disclosure will be described in greater detail in the following, with reference to the attached drawings, in which FIG. 1 schematically shows a cross-section of a microwave transmission line assembly according to one example of the disclosure, FIG. 2 schematically shows a cross-section of a microwave transmission line assembly according to one example of the disclosure, FIG. 3 schematically shows a cross-section of a microwave transmission line assembly according to one example of the disclosure, FIG. 4 schematically shows a cross-section of a microwave transmission line assembly according to one example of the disclosure, FIG. 5 schematically shows a cross-section of a microwave transmission line assembly according to one example of the disclosure, FIG. 6 schematically shows a cross-section of a microwave transmission line assembly according to one example of the disclosure, FIG. 7 schematically shows a cross-section of a microwave transmission line assembly according to one example of the disclosure, FIG. 8 schematically shows a cross-section of a microwave transmission line assembly according to one example of the disclosure, FIG. 9 schematically shows a cross-section of a microwave transmission line assembly according to one example of the disclosure, FIG. 10 schematically shows a cross-section of a microwave transmission line assembly according to one example of the disclosure, and wherein.

DESCRIPTION OF EXAMPLE EMBODIMENTS

Various aspects of the disclosure will hereinafter be described in conjunction with the appended drawings to illustrate and not to limit the disclosure, wherein like designations denote like elements, and variations of the described aspects are not restricted to the specifically shown embodiments, but are applicable on other variations of the disclosure.

Figure 1:
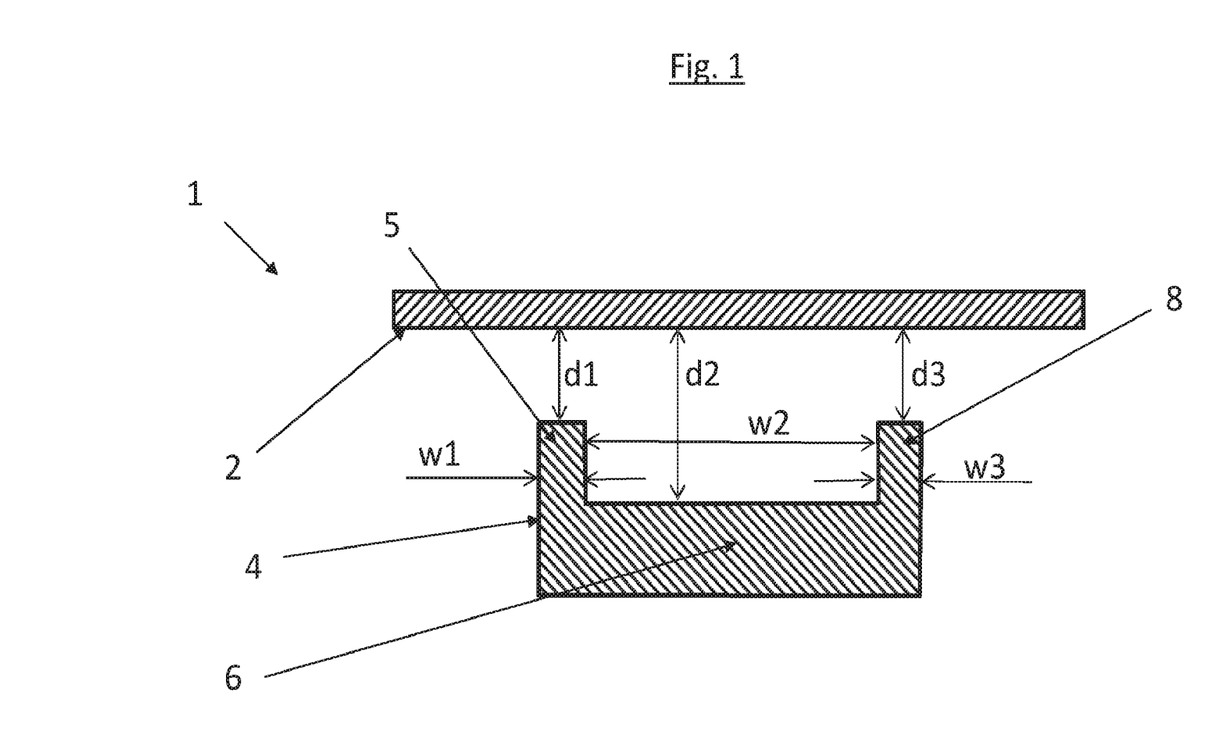

FIG. 1 schematically shows a microwave transmission line assembly 1 operated in vacuum for satellite antennas and beamforming networks comprising a first ground plane 2 and a conductor strip 4 positioned at a distance from the first ground plane. The conductor strip 4 comprises a first strip portion 5 and a second strip portion 6. The first strip portion 5 is positioned at a first distance d1 from the first ground plane and the second strip portion 6 is positioned at a second distance d2 from the first ground plane 2. The first distance d1 is smaller than the second distance 2 and the first distance d1 is chosen to avoid multipaction.

FIG. 1 shows that a first width w1 of the first strip portion 5 has a length less than the first distance d1.

FIG. 1 shows that the conductor strip 4 comprises a third strip portion 8 positioned at a third distance d3 from the first ground plane 2 and wherein the third distance d3 is smaller than the second distance d2.

FIG. 1 shows that a third width w3 of the third strip portion 8 has a length less than the third distance d3.

FIG. 1 shows that the first distance d1 is equal to the third distance d3 or wherein the first distance d1 is different from the third distance d3.

FIG. 1 shows that the first strip portion 5 is positioned at a predetermined first separation distance w2 from the third strip portion 8.

FIG. 1 shows an example with two strip portion protrusions 5, 8, i.e. the first and third strip portions 5, 8, extending from either side of the centrally positioned second strip portion 6. The conductor strip 4 can be formed in many different ways in order to avoid the problem with multipaction. FIGS. 1-11 shows a non-exhaustive list of examples and it should be noted that the conductor strip 2 in FIG. 1 could be arranged with only a first strip portion 5 and a second strip portion 6.

Figure 2:
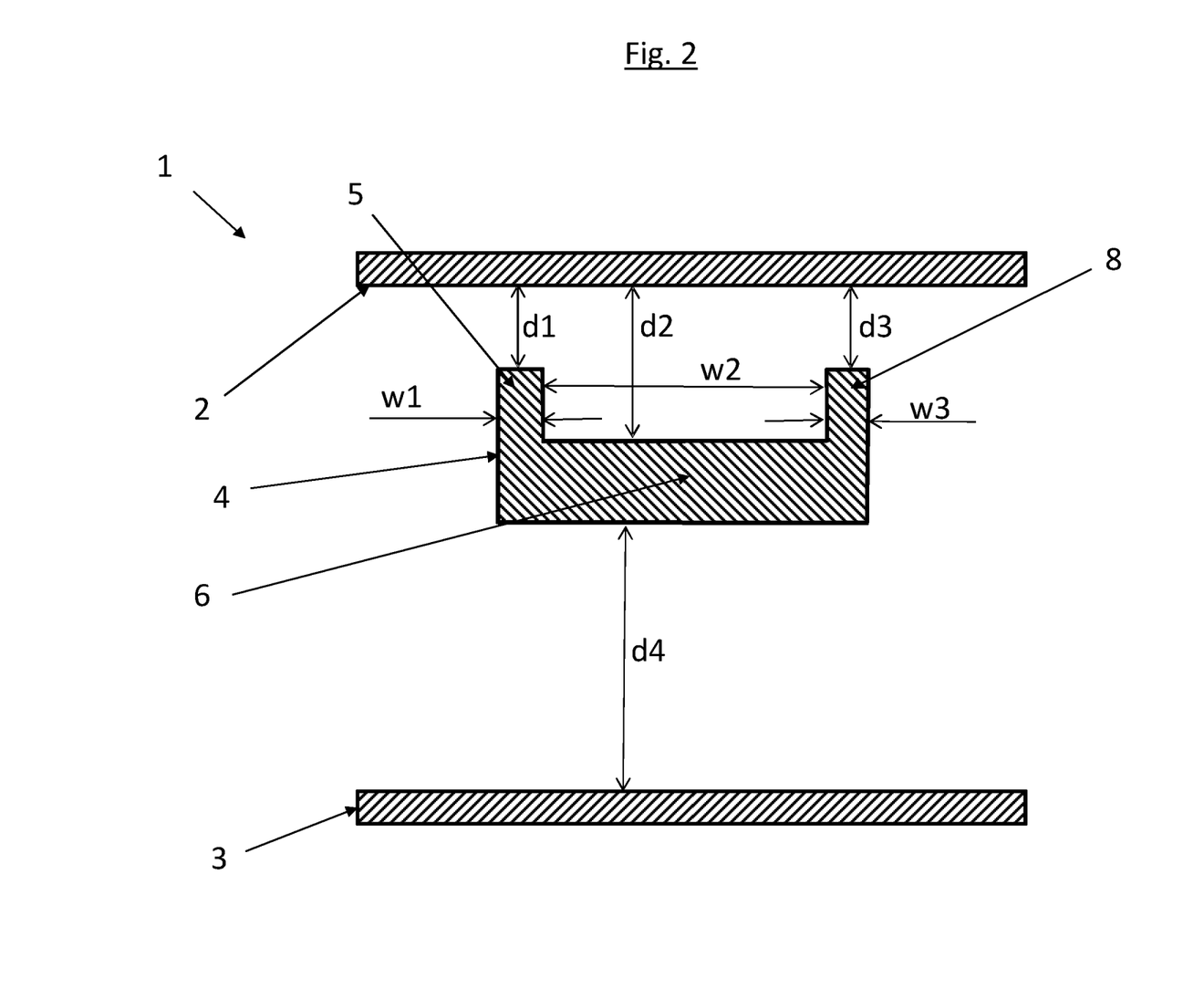

FIG. 2 schematically shows that the transmission line assembly 1 comprises a second ground plane 3 positioned opposite each the first ground plane 2. FIG. 2 shows the same features as in FIG. 1, but with an addition of the second ground plane. Here, the central conductor strip 4 is positioned between and at a distance from the first and second ground planes 2, 3.

FIG. 2 shows that the second strip portion 6 is positioned at a fourth distance d4 from the second ground plane 3.

The different forms and shapes of the conductor strip 2 in FIGS. 1-11 could be arranged with one ground plane as in FIG. 1 or two ground planes as shown in FIGS. 2-11. Furthermore, according to further examples (not shown) the transmission line assembly comprises one or two side walls connecting the first and second ground planes. The side walls and the first and second ground planes can be arranged to encapsulate the conductor strip partly or entirely.

Figure 3:
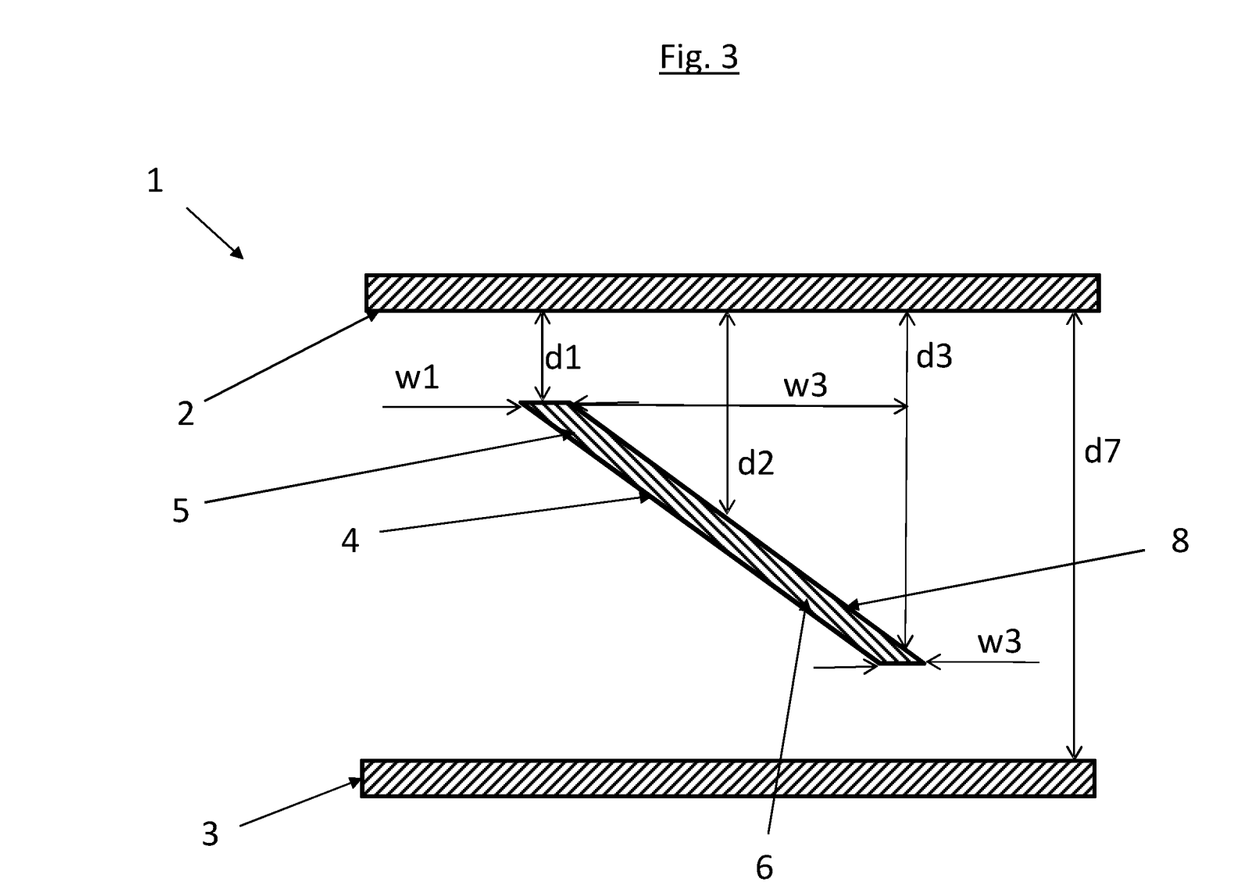

FIG. 3 shows the same features as in FIG. 2, but with a different geometrical arrangement of the conductor strip 4. FIG. 3 schematically shows one example where the conductor strip 4 has an essentially rectangular cross section being arranged somewhat diagonally with reference to the ground planes 2, 3. Such an arrangement gives a conductor strip 4 with an end portion, i.e. the first strip portion 5, close to one ground plane, i.e. the first ground plane 2 and another end portion, i.e. the second strip portion 6, close to the second ground plane 3 compared to the second strip portion 6 being a portion of the conductor strip 2 positioned between the end portions 5, 8. In another example (not shown), one end portion, i.e. the first strip portion 5, is arranged close to the first ground plane 2, and the other end portion 8 is maintained in the middle of the transmission line. Here, middle of the transmission line relates to a position essentially between the first and second ground planes 2, 3.

Figure 4:
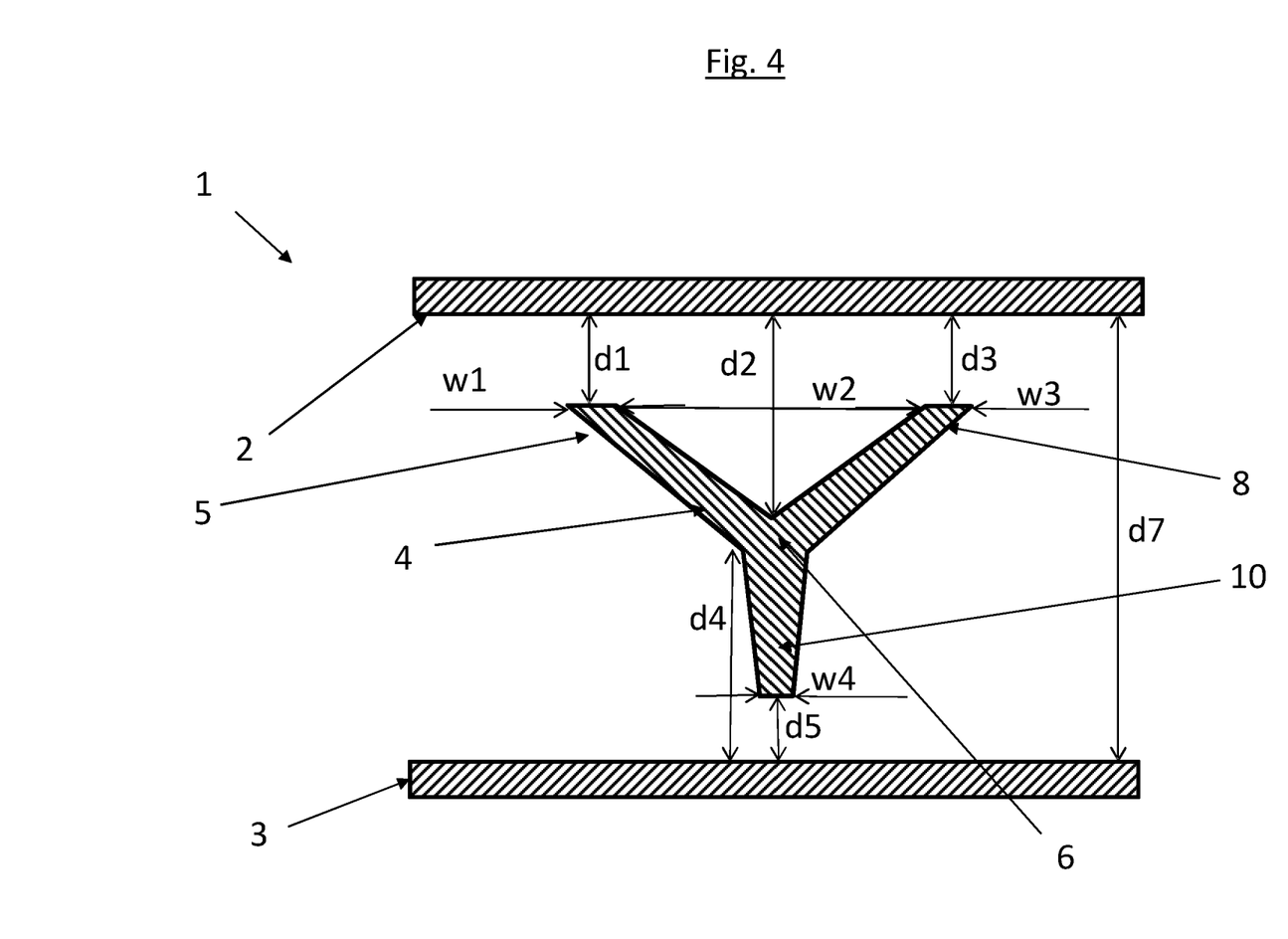
Figure 9:
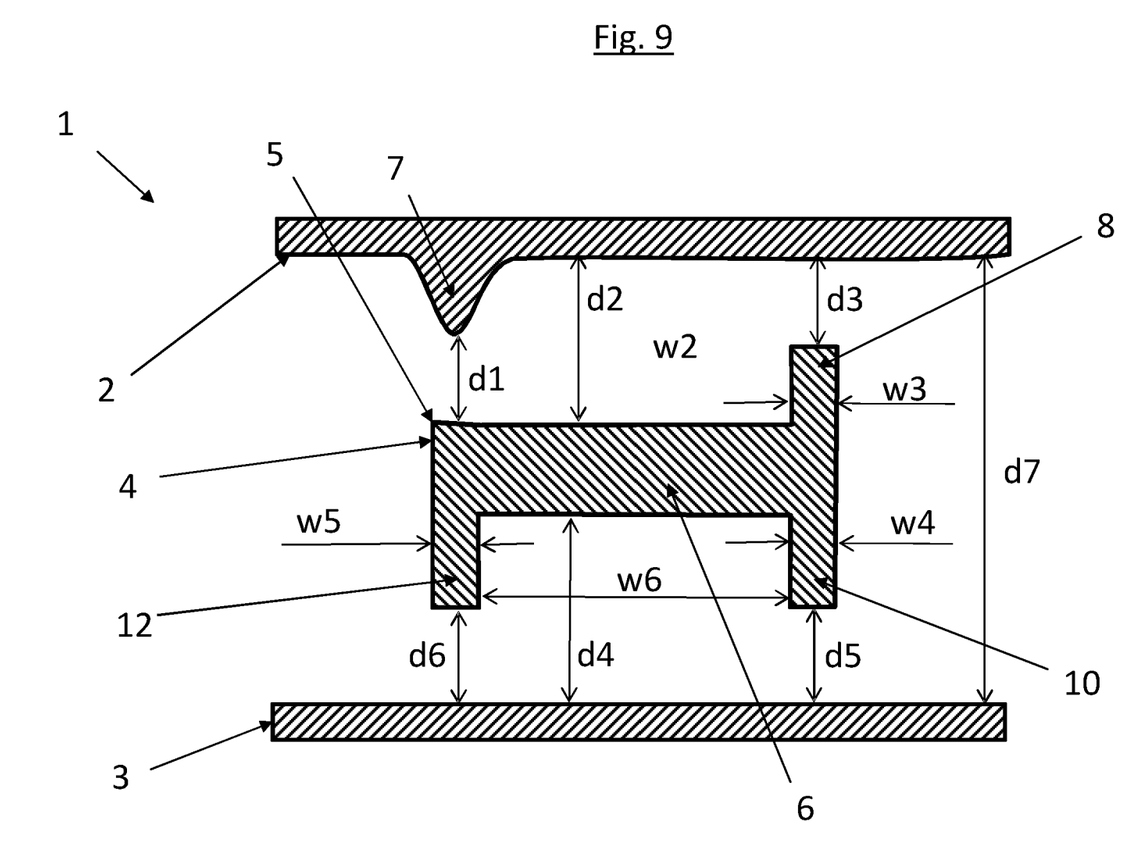

FIG. 4 schematically shows that the conductor strip 4 comprises a fourth strip portion 10 positioned at a fifth distance d5 from the second ground plane 3 and wherein the fifth distance d5 is smaller than the fourth distance d4. FIG. 4 shows a configuration of the conductor strip 2 in the form of a Y-shape. However, there are numerous variants of a conductor strip with three protruding strip portions. FIG. 9 shows an example of a different form where the conductor strip 2 has an essentially rectangular main body including the second strip portion 6, and with three protruding strip portions 8, 10, 12.

FIG. 4 shows that a fourth width w4 of the fourth strip portion 10 has a length less than the fifth distance d5.

Figure 5:
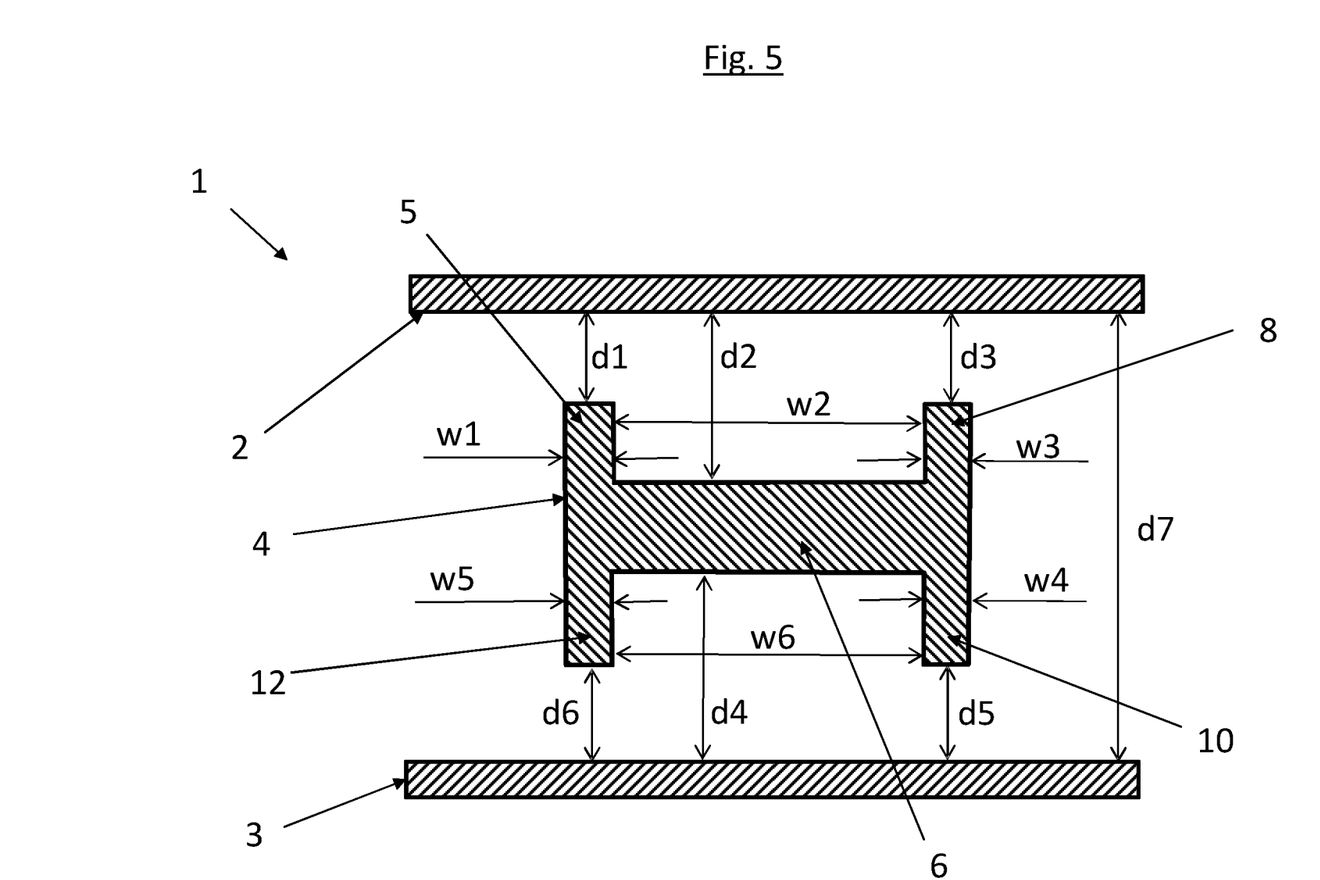

FIG. 5 schematically shows that the second strip portion 6 is positioned at the fourth distance d4 from the second ground plane 3. The conductor strip 4 comprises a fifth strip portion 12 positioned at a sixth distance d6 from the second ground plane 3 and wherein the sixth distance d6 is smaller than the fourth distance d4.

FIG. 5 shows that a fifth width w5 of the fifth strip portion 12 has a length less than the sixth distance d6. The fifth distance d5 is equal to the sixth distance d6 or wherein the fifth distance d5 is different from the sixth distance d6.

FIG. 5 shows that the fourth strip portion 10 is positioned at a predetermined second separation distance w6 from the fifth strip portion 12.

Figure 6:
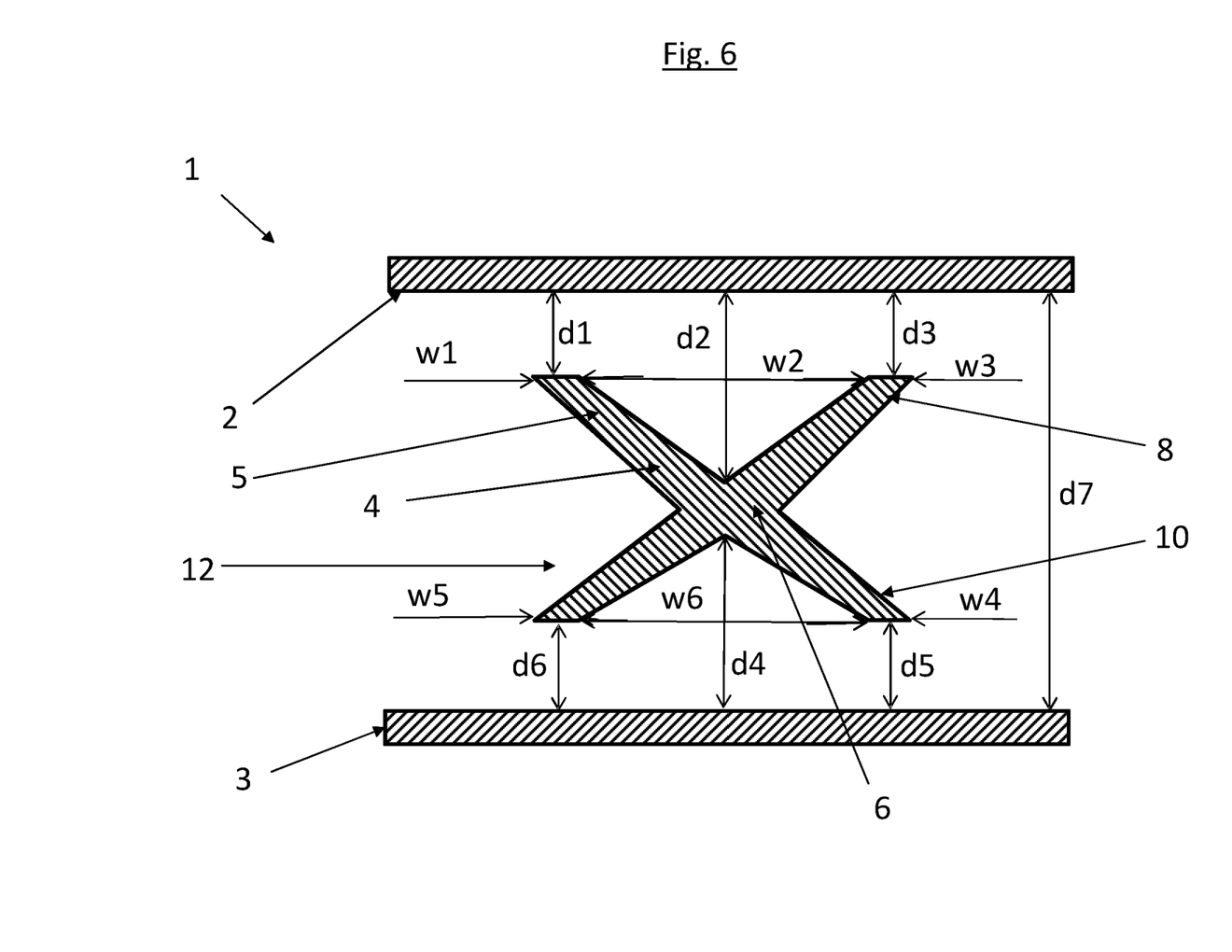

FIG. 5 shows an example of a conductor strip 4 arranged in the form having an essentially rectangular main body including the second strip portion 6, and four protruding strip portions 5, 8, 10, 12 on each corner of the rectangular main body. The arrangement with four protruding strip portions 5, 8, 10, 12 in the conductor strip 2 can be arranged in many different variations. FIG. 6 schematically shows the same as FIG. 5, but with a different geometrical form where the conductor strip 2 is arranged in an X-shape. In FIG. 6 the four protruding strip portions 5, 8, 10, 12 protrude diagonally out from a centrally positioned second strip portion 6.

Figure 7:
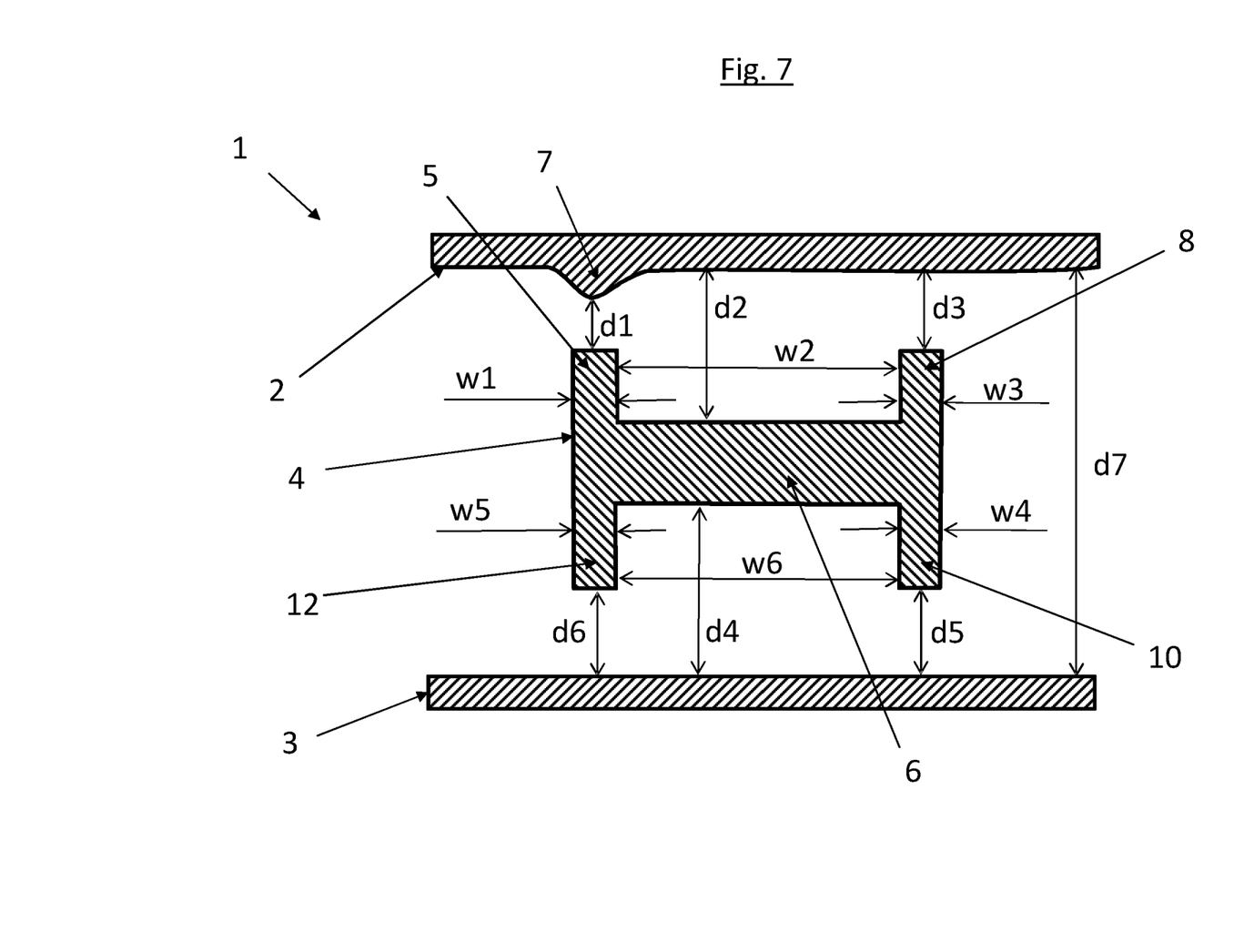

FIG. 7 schematically shows that the first ground plane 2 comprises a first ground plane protrusion 7 in connection to the first strip portion 5. This arrangement could replace a protruding first strip portion 5 such that the first distance d1 becomes less than the second distance d2, even if the conductor strip lacks a protrusion in the first strip portion 5. FIG. 9 shows such an arrangement in connection to the first strip portion 5. As an alternative, the first strip portion 5 protrudes towards the first ground plane 2 with relation to the second strip portion as depicted in FIGS. 1-6. As yet an alternative, the first strip portion 5 protrudes towards the first ground plane 2 with relation to the second strip portion 6, and the first ground plane 2 comprises a first ground plane protrusion 7 in connection to the first strip portion 5, as depicted in FIG. 7.

Figure 8:
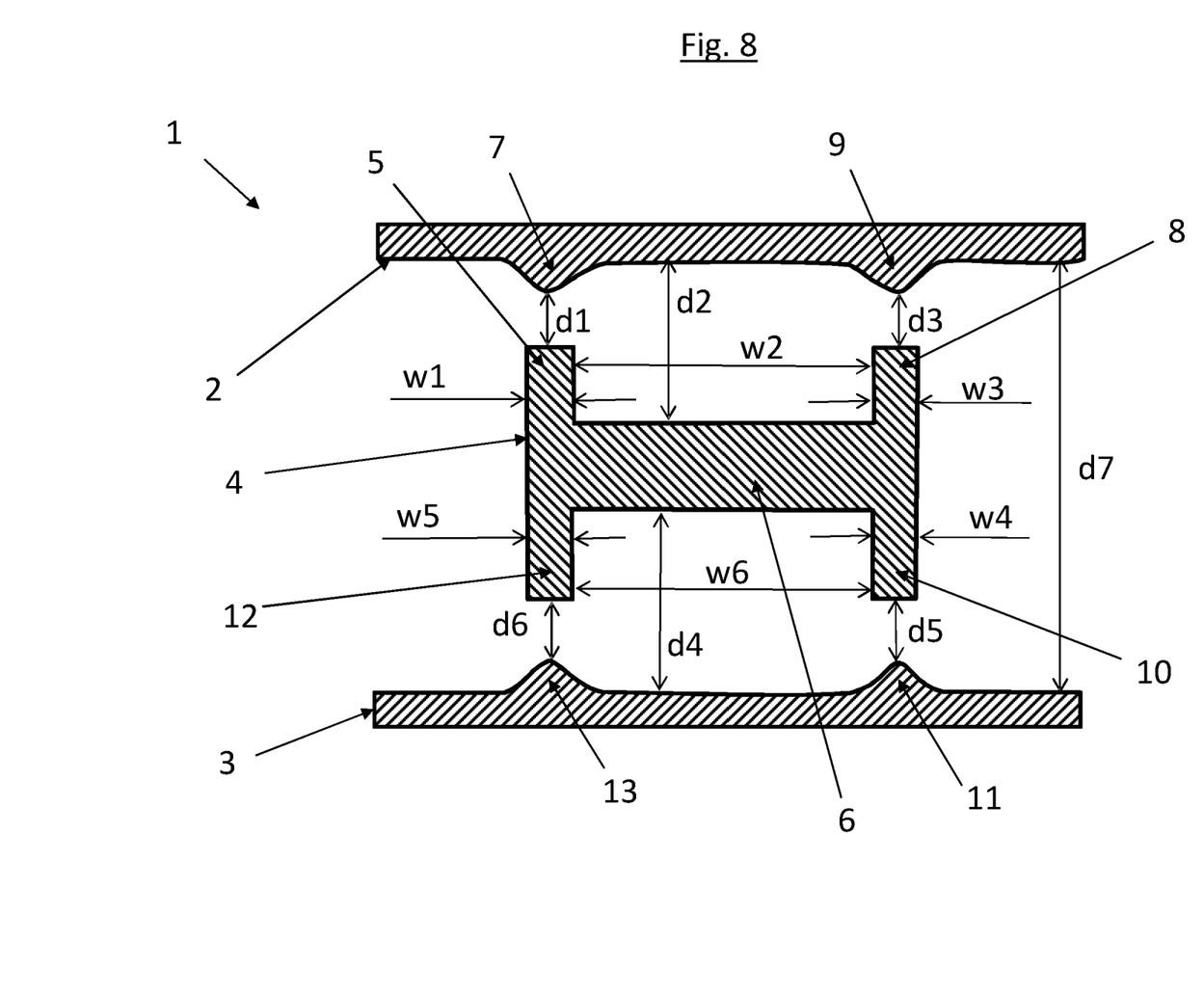

FIG. 8 schematically shows the same as in FIG. 7, but with the addition that the first ground plane 2 comprises a second ground plane protrusion 9 in connection to the third strip portion 8 and/or wherein the third strip portion 8 protrudes towards the first ground plane 2 with relation to the second strip portion 6.

FIG. 8 schematically further shows that the second ground plane 3 comprises a third ground plane protrusion 11 in connection to the fourth strip portion 10 and/or wherein the fourth strip portion 10 protrudes towards the second ground plane 3 with relation to the second strip portion 6.

FIG. 8 schematically further shows that the second ground plane 3 comprises a fourth ground plane protrusion 13 in connection to the fifth strip portion and/or wherein the fifth strip portion 12 protrudes towards the second ground plane 3 with relation to the second strip portion 6.

The arrangement with the first ground plane protrusion 7 and/or the second ground plane protrusion 9 and/or the third ground plane protrusion 11 and/or the fourth ground plane protrusion 13 could replace a protruding first strip portion 5 and/or a protruding third strip portion 8 and/or a protruding fourth strip portion 10 and/or a protruding fourth strip portion 12. FIG. 8 shows a transmission line assembly 1 comprising the first ground plane protrusion 7 and the second ground plane protrusion 9 and the third ground plane protrusion 11 and the fourth ground plane protrusion 13, and a protruding first strip portion 5 and a protruding third strip portion 8 and a protruding fourth strip portion 10 and a protruding fifth strip portion 12. The arrangement can be varied such that there is one or more strip portions 5, 8, 10, 12 protruding against one or both of the ground planes 2, 3, and where one or both the ground planes 2, 3 comprise protrusions 7, 9, 11, 13.

FIG. 9 shows an arrangement in connection to the first strip portion 5 where the first distance d1 becomes less than the second distance d2 due to the first ground plane protrusion 7 even if the conductor strip 2 lacks a protrusion in the first strip portion 5. FIG. 9 shows that the third distance d3 becomes less than the second distance d2 due to a protruding third strip portion 8 without a ground plane protrusion. FIG. 9 further shows a transmission line assembly 1 comprising a protruding fourth strip portion 10 and a protruding fifth strip portion 12, but no corresponding ground plane protrusions. Hence, the arrangement can be varied such that there is one or more strip portions 5, 8, 10, 12 protruding against one or both of the ground planes 2, 3, and where one or both the ground planes 2, 3 comprise protrusions 7, 9, 11, 13.

Figure 10:
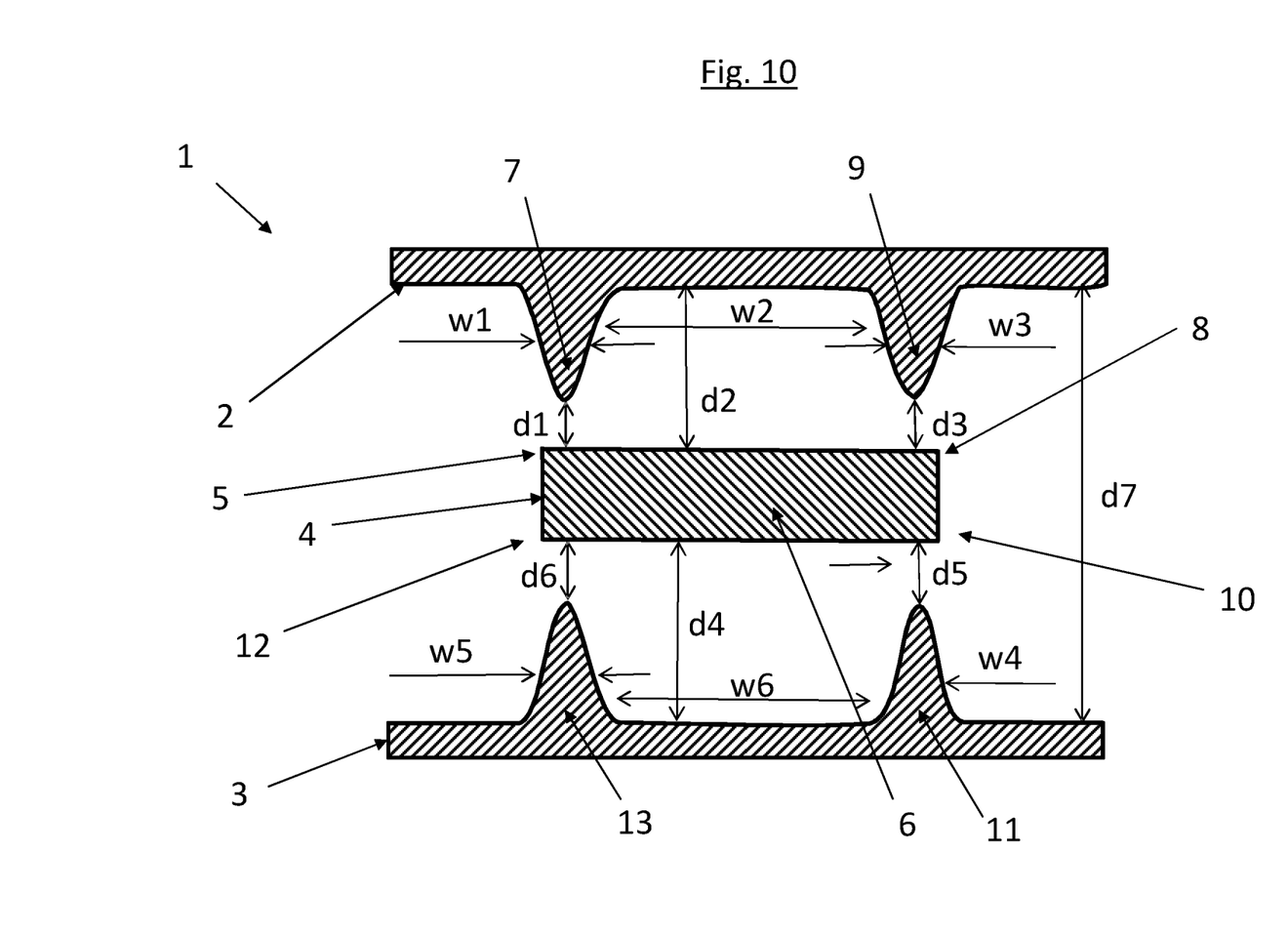

FIG. 10 shows an arrangement where the conductor strip 2 lacks protrusions, but where the transmission line assembly 1 comprises the first ground plane protrusion 7 and the second ground plane protrusion 9 and the third ground plane protrusion 11 and the fourth ground plane protrusion 13 in connection to the respective first, third, fourth and fifth strip portions 5, 8, 10, 12.

Figure 11:
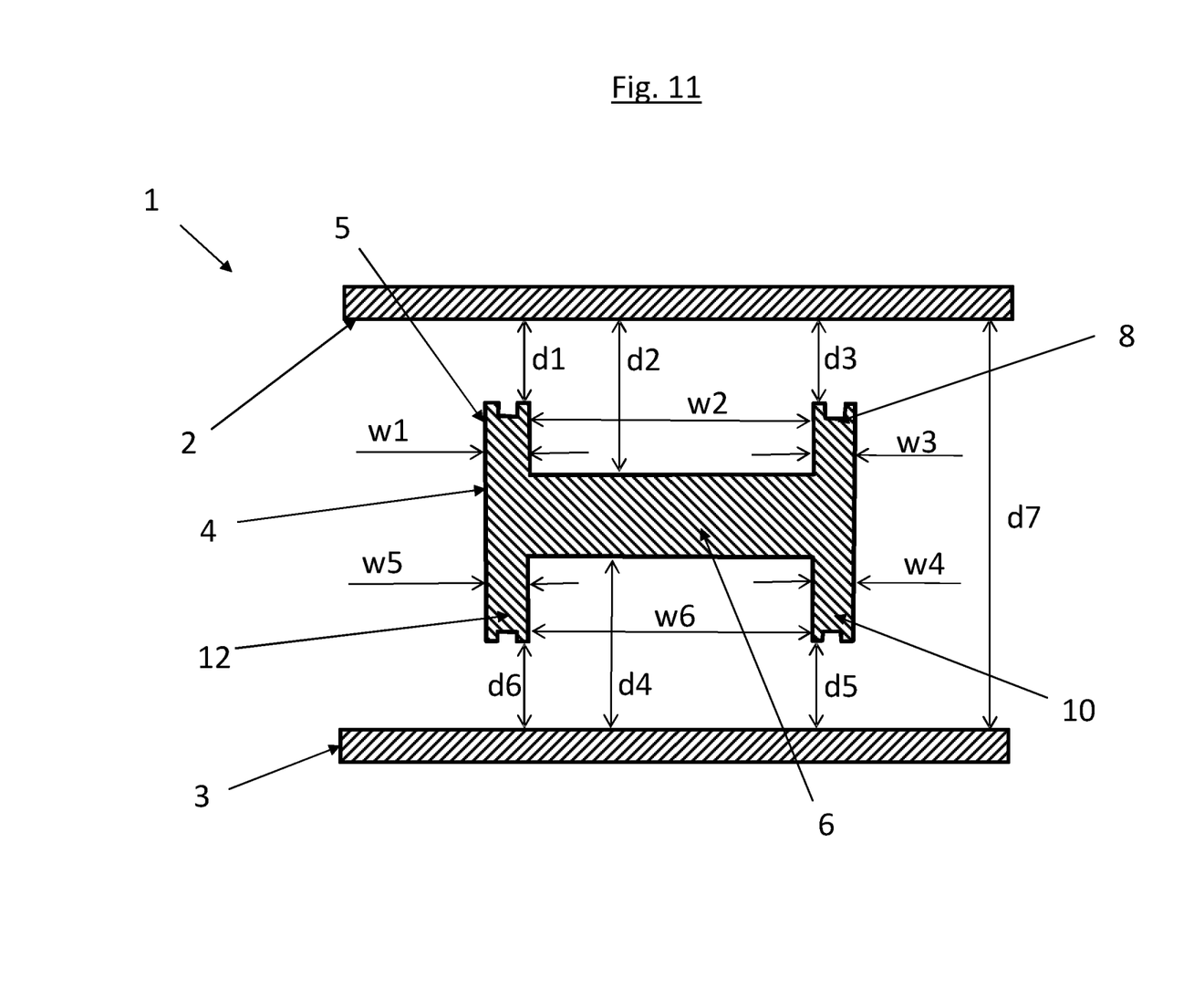
FIG. 11 schematically shows a cross-section of a microwave transmission line assembly according to one example of the disclosure.

FIG. 11 shows an arrangement where the end portions of one or more protruding strip portions 5, 8, 10, 12 comprises one or a number of minor protrusions 14 toward the ground planes 2, 3. Between the minor protrusions 14 are created indentations/valleys 15 that act as an electron trap which further reduces multipaction.

According to one example (not shown), the end portions of one or more ground plane protrusions comprises one or a number of minor protrusions toward the ground planes. Between the minor protrusions are created indentations/valleys that acts as an electron trap which further reduces multipaction.

It is also possible to combine minor protrusions at the end portions of one or more protruding strip portions and minor protrusions at the end portions of one or more ground plane protrusions.

In FIGS. 2-11 the first ground plane 2 is positioned at a seventh distance d7 from the second ground plane 3.

In FIGS. 2-11 the fourth distance d4 can exceed the second distance d2. The fourth distance d4 can then be arranged to be big enough to avoid multipaction by the sheer distance. The latter is especially advantageous in connection to the example shown in FIG. 2.

It will be appreciated that the above description is merely exemplary in nature and is not intended to limit the present disclosure, its application or uses. While specific examples have been described in the specification and illustrated in the drawings, it will be understood by those of ordinary skill in the art that various changes may be made and equivalents may be substituted for elements thereof without departing from the scope of the present disclosure as defined in the claims. Furthermore, modifications may be made to adapt a particular situation or material to the teachings of the present disclosure without departing from the essential scope thereof. Therefore, it is intended that the present disclosure not be limited to the particular examples illustrated by the drawings and described in the specification as the best mode presently contemplated for carrying out the teachings of the present disclosure, but that the scope of the present disclosure will include any embodiments falling within the foregoing description and the appended claims. Reference signs mentioned in the claims should not be seen as limiting the extent of the matter protected by the claims, and their sole function is to make claims easier to understand.

REFERENCE SIGNS

1. Transmission line assembly
2. First ground plane
3. Second ground plane
4. Conductor strip
5. First strip portion
6. Second strip portion
7. First ground plane protrusion
8. Third strip portion
9. Second ground plane protrusion
10. Fourth strip portion
11. Third ground plane protrusion
12. Fifth strip portion
13. Fourth ground plane protrusion
14. Minor protrusions
15. Indentations/Valleys

The invention claimed is:

1. An air strip microwave transmission line assembly operated in vacuum for satellite antennas, beamforming networks and other microwave components for satellite applications comprising:
a first ground plane; and
a conductor strip positioned at a distance from the first ground plane, wherein the geometrical arrangement of the conductor strip relates to a cross-section of the microwave transmission line assembly,
wherein the conductor strip comprises a rectangular main body, the main body comprising a first strip portion and a second strip portion both arranged on a same side of the conductor strip which faces the first ground plane,
wherein the first strip portion is positioned at a first distance from the first ground plane and wherein the second strip portion is positioned at a second distance from the first ground plane,
wherein the first strip portion of the main body is bent or arranged diagonally in relation to the second strip portion such that the first distance is smaller than the second distance,
wherein the conductor strip is configured to change an electromagnetic field in the transmission line by creating a fringing electromagnetic field in a vicinity of the first strip portion such that a plurality of excited electrons in the vicinity of the first strip portion arranged at the smaller first distance from the first ground plane travel in a direction essentially parallel to the first ground plane, whereby a multipaction between the first strip portion and the first ground plane is avoided,
wherein the conductor strip comprises a third strip portion positioned at a third distance from the first ground plane, the wherein the third distance is smaller than the second distance,
wherein the first distance is different from the third distance, and
wherein the first strip portion and the third strip portion are on a same side of the second portion.

2. The air strip microwave transmission line assembly according to claim 1, wherein the transmission line assembly comprises a second ground plane positioned opposite the first ground plane, wherein the conductor strip is positioned between and at a distance from the first and second ground planes.

3. The air strip microwave transmission line assembly according to claim 2, wherein the second strip portion is positioned at a fourth distance from the second ground plane.

4. The air strip microwave transmission line assembly according to claim 3, wherein the second strip portion is positioned at the fourth distance from the second ground plane, wherein the conductor strip comprises a fifth strip portion positioned at a sixth distance from the second ground plane and wherein the sixth distance is smaller than the fourth distance.

5. The air strip microwave transmission line assembly according to claim 4, wherein a fifth width of the fifth strip portion is less than the sixth distance.

6. The air strip microwave transmission line assembly according to claim 4, wherein the fifth distance is equal to the sixth distance or wherein the fifth distance is different from the sixth distance.

7. The air strip microwave transmission line assembly according to claim 4, wherein the second ground plane comprises a fourth ground plane protrusion in connection to the fifth strip portion and/or wherein the fifth strip portion protrudes towards the second ground plane with relation to the second strip portion.

8. The air strip microwave transmission line assembly according to claim 4, wherein the fourth strip portion is positioned at a predetermined second separation distance from the fifth strip portion.

9. The air strip microwave transmission line assembly according to claim 3, wherein the conductor strip comprises a fourth strip portion positioned at a fifth distance from the second ground plane and wherein the fifth distance is smaller than the fourth distance.

10. The air strip microwave transmission line assembly according to claim 9, wherein a fourth width of the fourth strip portion is less than the fifth distance.

11. The air strip microwave transmission line assembly according to claim 9, wherein the second ground plane comprises a third ground plane protrusion in connection to the fourth strip portion and/or wherein the fourth strip portion protrudes towards the second ground plane with relation to the second strip portion.

12. The air strip microwave transmission line assembly according to claim 3, wherein the fourth distance exceeds the second distance, and wherein the fourth distance is big enough to avoid the multipaction.

13. The air strip microwave transmission line assembly according to claim 1, wherein a first width of the first strip portion is less than the first distance.

14. The air strip microwave transmission line assembly according to claim 1, wherein the first ground plane comprises a first ground plane protrusion in connection to the first strip portion and/or wherein the first strip portion protrudes towards the first ground plane with relation to the second strip portion.

15. The air strip microwave transmission line assembly according to claim 1, wherein a third width of the third strip portion is less than the third distance.

16. The air strip microwave transmission line assembly according to claim 1, wherein the first distance is equal to the third distance or wherein the first distance is different from the third distance.

17. The air strip microwave transmission line assembly according to claim 1, wherein the first ground plane comprises a second ground plane protrusion in connection to the third strip portion and/or wherein the third strip portion protrudes towards the first ground plane with relation to the second strip portion.

18. The air strip microwave transmission line assembly according to claim 1, wherein the first strip portion is positioned at a predetermined first separation distance from the third strip portion.

19. The air strip microwave transmission line assembly according to claim 1, wherein the transmission line assembly is a strip line.

\* \* \* \* \*